(12) United States Patent
Ikeda et al.

(10) Patent No.: US 10,614,014 B2
(45) Date of Patent: Apr. 7, 2020

(54) SEMICONDUCTOR STORAGE DEVICE HAVING A MEMORY CONTROLLER, A SELECTION UNIT AND A SWITCH UNIT CONNECTED TO EACH OTHER

(71) Applicant: HITACHI, LTD., Tokyo (JP)

(72) Inventors: Yasuhiro Ikeda, Tokyo (JP); Yutaka Uematsu, Tokyo (JP); Shungo Okabe, Yokohama (JP); Akihiro Inamura, Yokohama (JP); Takahiko Iwasaki, Yokohama (JP); Junji Ogawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/093,664

(22) PCT Filed: Sep. 26, 2016

(86) PCT No.: PCT/JP2016/078284
§ 371 (c)(1),
(2) Date: Oct. 15, 2018

(87) PCT Pub. No.: WO2018/055768
PCT Pub. Date: Mar. 29, 2018

(65) Prior Publication Data
US 2019/0073330 A1    Mar. 7, 2019

(51) Int. Cl.
*G11C 8/12*   (2006.01)
*G06F 13/40*  (2006.01)
(Continued)

(52) U.S. Cl.
CPC ........ *G06F 13/4022* (2013.01); *G06F 3/0629* (2013.01); *G06F 3/0688* (2013.01);
(Continued)

(58) Field of Classification Search
CPC ............. G06F 13/4022; G06F 13/1684; G06F 12/0246; G06F 3/0688; G06F 3/0629;
(Continued)

(56) References Cited

U.S. PATENT DOCUMENTS

2005/0286284 A1* 12/2005 See ................. G11C 16/02
365/63
2008/0046640 A1* 2/2008 Han ................. G06F 1/3203
711/103
(Continued)

FOREIGN PATENT DOCUMENTS

JP    2007-149138 A    6/2007
JP    2010-003161 A    1/2010

OTHER PUBLICATIONS

International Search Report of PCT/JP2016/078284 dated Dec. 6, 3016.

*Primary Examiner* — Khamdan N. Alrobaie
(74) *Attorney, Agent, or Firm* — Mattingly & Malur, PC (57) ABSTRACT

To increase the number of selectable chips without adding a signal line to a general purpose memory controller. A semiconductor storage device includes a memory controller, a plurality of memory chips, a selection unit which is connected to the memory controller and is connected with the plurality of memory chips to be able to select any one of the plurality of memory chips, and a switch unit which is connected to the memory controller and the selection unit. The memory controller and the selection unit are connected by a signal line for transmitting a first signal outputted from the memory controller and configured to select the memory chips. The memory controller and the switch unit are connected by a signal line for transmitting a second signal outputted from the memory controller and configured to select the memory chips.

7 Claims, 4 Drawing Sheets

(51) Int. Cl.
*G06F 12/06* (2006.01)
*G11C 7/10* (2006.01)
*G06F 3/06* (2006.01)
*G06F 12/02* (2006.01)
*G06F 13/16* (2006.01)
*G11C 7/20* (2006.01)

(52) U.S. Cl.
CPC .......... *G06F 12/0246* (2013.01); *G06F 12/06* (2013.01); *G06F 13/1684* (2013.01); *G11C 7/1075* (2013.01); *G11C 8/12* (2013.01); *G06F 13/1689* (2013.01); *G11C 7/20* (2013.01)

(58) Field of Classification Search
CPC ... G06F 13/1689; G06F 12/06; G11C 7/1075; G11C 7/20; G11C 8/12
See application file for complete search history.

(56) References Cited

U.S. PATENT DOCUMENTS

| | | | |
|---|---|---|---|
| 2008/0311684 A1* | 12/2008 | Tu | H01L 22/20 438/4 |
| 2009/0319716 A1* | 12/2009 | Nagadomi | G06F 13/1684 710/316 |
| 2010/0030942 A1* | 2/2010 | Hinkle | G06F 12/06 711/5 |
| 2011/0102065 A1* | 5/2011 | Jin | G11C 5/04 327/524 |
| 2014/0112073 A1* | 4/2014 | Ikeda | G06F 12/0246 365/185.11 |
| 2016/0012864 A1* | 1/2016 | Park | G11C 29/46 365/51 |
| 2016/0154057 A1* | 6/2016 | Oshiyama | G01R 31/3177 714/727 |
| 2017/0286345 A1* | 10/2017 | Ikeda | G06F 13/4022 |

* cited by examiner

SEMICONDUCTOR STORAGE DEVICE HAVING A MEMORY CONTROLLER, A SELECTION UNIT AND A SWITCH UNIT CONNECTED TO EACH OTHER

TECHNICAL FIELD

The present invention relates to a semiconductor storage device.

BACKGROUND ART

In recent years, the market of flash storage products tends to expand, and there is a demand for larger capacity and higher performance of flash storage. In order to make the flash storage have larger capacity, it is necessary to mount a plurality of memory chips, and to increase signal lines for chip selection which are outputted by a memory controller as the number of the memory chips increases.

PTL 1 describes that "A memory system, including a NAND memory mounted with a plurality of Chips, and a NAND controller 112 for controlling the NAND memory, is provided with a bus switch for switching connections of a signal line between the NAND controller 112 and the plurality of Chips mounted on the NAND memory, so that load capacities of the signal lines during an access to a NAND memory 10 are reduced and signal delay is prevented.".

PRIOR ART LITERATURE

Patent Literature

PTL 1: JP-A-2010-3161

SUMMARY OF INVENTION

Technical Problem

In the memory system described in PTL 1, a control unit and a signal line, which output a dedicated control signal for switching the bus switch, are additionally provided on the memory controller. That is, such a memory system cannot adopt a general purpose memory controller, and a dedicated memory controller must be prepared. Therefore, such a memory system cannot be configured with general purpose components, and requires a high manufacturing cost.

Accordingly, an object of the invention is to provide a semiconductor storage device which can increase the number of selectable chips without adding a signal line to a general purpose memory controller.

Solution to Problem

The present application includes a plurality of means for solving at least some of the above-mentioned problems, and examples thereof are given as follows.

One aspect of the invention is a semiconductor storage device, including: a memory controller; a plurality of memory chips; a selection unit which is connected to the memory controller, and is connected with the plurality of memory chips to be able to select any one of the plurality of memory chips; and a switch unit which is connected to the memory controller and the selection unit, in which the memory controller and the selection unit are connected by a signal line for transmitting a first signal outputted from the memory controller and configured to select the memory chips, and the memory controller and the switch unit are connected by a signal line for transmitting a second signal outputted from the memory controller and configured to select the memory chips.

Advantageous Effect

According to the invention, it is possible to increase the number of selectable chips without adding a signal line to the general purpose memory controller.

Problems, configurations and effects other than those mentioned above will be apparent from the description of the embodiments below.

DESCRIPTION OF EMBODIMENTS

Hereinafter, a plurality of embodiments of the invention will be described with reference to the drawings.

First Embodiment

Figure 1:
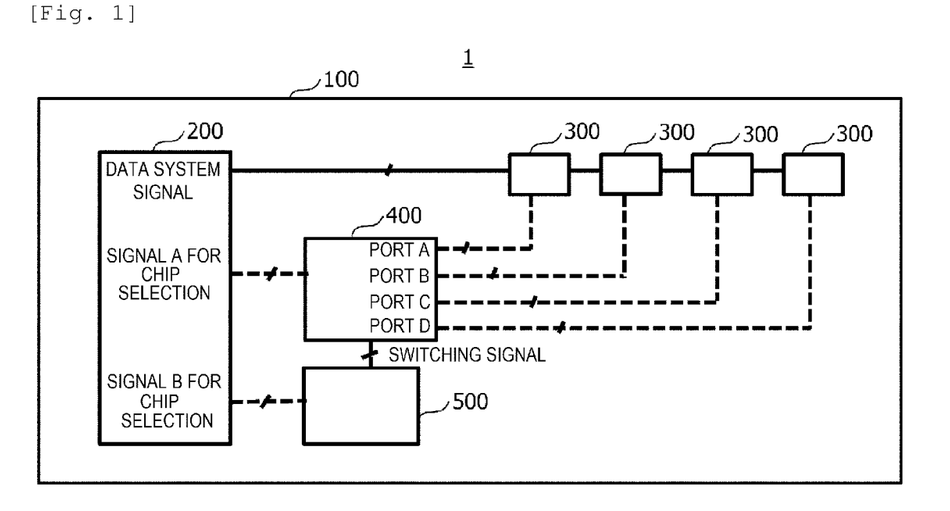
FIG. 1 is a diagram showing a schematic configuration example of a semiconductor storage device according to a first embodiment of the invention.

FIG. 1 is a diagram showing a schematic configuration example of a semiconductor storage device according to a first embodiment of the invention. A semiconductor storage device 1 includes a memory controller 200 and a plurality of storage units 300, the memory controller 200 and the plurality of storage units 300 being mounted on a system substrate 100. In addition, the semiconductor storage device 1 includes a decoder/switch 400 (corresponding to a "selection unit" of the invention) and a latch circuit 500 (corresponding to a "switch unit" of the invention), the decoder/switch 400 and the latch circuit 500 being mounted on the system substrate 100. For example, the semiconductor storage device 1 is mounted and used in an electronic device such as a PC (Personal Computer), a smart phone and a tablet computer.

The memory controller 200 controls an access such as data reading/writing to each storage unit 300. The memory controller 200 can be implemented by a semiconductor device such as an ASIC (Application Specific Integrated Circuit), an LSI (Large-scale Integrated Circuit) and a CPU (Central Processing Unit). An existing general purpose memory controller can be used in the semiconductor storage device 1 of the present embodiment.

A data system signal line of the memory controller 200 is connected to each storage unit 300 in series. A data system signal refers to a signal besides a signal for chip selection such as a data signal, a strobe signal and a control signal, and includes, for example, a DQ (Data Signal), a DQS (Data Strobe Signal), a RE # (Read Enable Signal), an ALE (Address Latch Enable Signal), a CLE (Command Latch Enable Signal), a WE # (Write Enable Signal), a R/B # (Ready/Busy Signal), or the like.

A part of a signal line for chip selection of the memory controller 200 is connected to the decoder/switch 400. The rest (or the rest part) of the signal line for chip selection of the memory controller 200 is connected to the latch circuit 500. The signal for chip selection includes, for example, a CE # (Chip Enable Signal), a CS (Chip Select Signal), or the like. In the following description, apart of signals for chip selection is referred to as "signal A for chip selection (corresponding to a "first signal" of the invention)", and the rest (or the rest part) of the signals for chip selection are referred to as "signal B for chip selection (corresponding to a "second signal" of the invention)".

Each storage unit 300 is, for example, a NAND flash memory element. Each storage unit 300 corresponds to a memory chip, and may be included in one package, or may be included in a plurality of packages. Incidentally, the storage unit 300 is not limited to the NAND flash memory element, and may be a semiconductor memory element such as a ReRAM (Resistance Random Access Memory), a MRAM (Magneto resistive RAM) and a PCM (Phase Change Memory).

The decoder/switch 400 branches the signal line for chip selection (signal A) from the memory controller 200. The decoder/switch 400 includes ports A to D connected with each storage unit 300 respectively, and a bus switch (not shown) capable of selecting each port. In addition, the decoder/switch 400 includes a decoder (not shown) for decoding a switching signal which is outputted from the latch circuit 500 and configured to switch the ports. The decoder/switch 400 receives and decodes the switching signal from the latch circuit 500, and switches a connecting port to a port indicated by the switching signal (that is, selects a port).

In addition, the decoder/switch 400 includes a decoder (not shown) for decoding the signal A for chip selection outputted from the memory controller 200. The decoder/switch 400 receives and decodes the signal A for chip selection outputted from the memory controller 200, and outputs the decoded signal A for chip selection to a selected port.

The latch circuit 500 is connected to the decoder/switch 400. The latch circuit 500 receives and decodes the signal B for chip selection outputted from the memory controller 200, and stores and outputs a value showing the port number indicated by the signal B (that is, outputs the switching signal).

Figure 2:
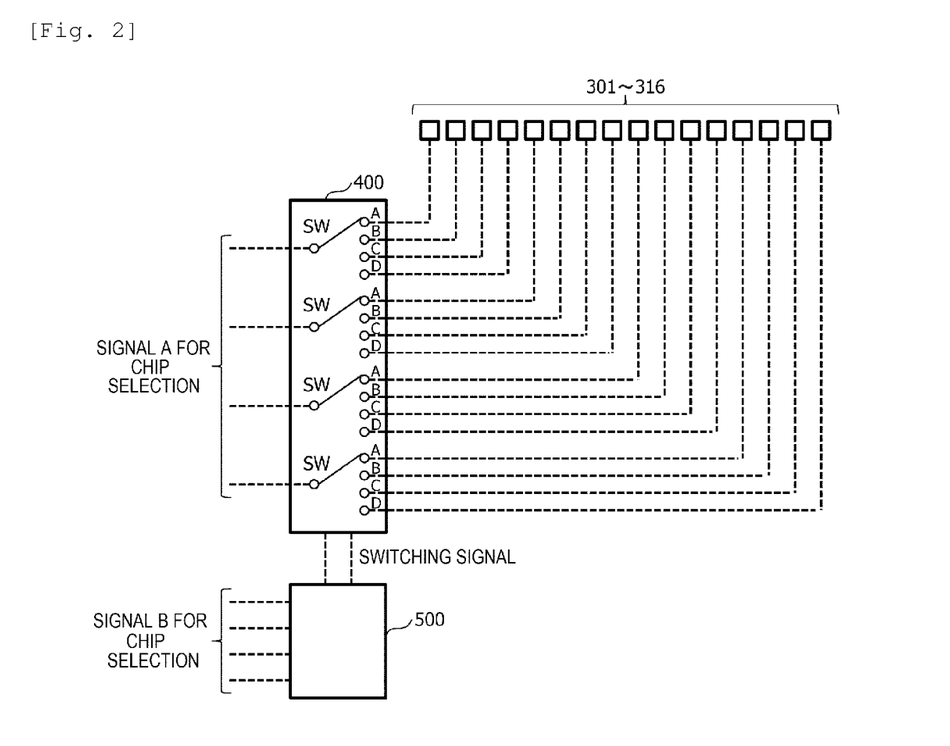
FIG. 2 is a diagram showing a connection configuration example of a plurality of chips according to the first embodiment of the invention.

FIG. 2 is a diagram showing a connection configuration example of a plurality of chips according to the first embodiment of the invention. The decoder/switch 400 includes four bus switches SWs. The four ports A to B are provided at each bus switch SW in a switchable manner. Memory chips 301 to 316 are connected to the ports respectively.

The signal B for chip selection is, for example, four bits, and one bit corresponding to a switching destination port is asserted in a state of 0 or 1. The switching signal is, for example, two bits, and can distinguish four ports by a combination of the state of 0 or 1 of each bit. The signal B inputted to the latch circuit 500 is converted into a switching signal, and the switching signal is stored and outputted.

The signal A for chip selection is, for example, four bits, and one bit corresponding to an enabled (or selected) memory chip is asserted to be 0 or 1. The signal A inputted to the decoder/switch 400 is outputted from a selected port via each bus switch SW. The memory chip connected to the selected port is enabled (or selected) by the signal A.

As seen from the above-mentioned connection configuration example, the semiconductor storage device 1 in the present embodiment divides the signal (for example, eight bits) for chip selection outputted from the memory controller 200 into two signals (for example, four bits each) and uses the two signals, switches the chip to be connected according to one signal (signal B), and enables (or selects) the chip to be accessed according to the other signal (signal A). Accordingly, the number of selectable memory chips can be increased without adding a signal line to the memory controller 200.

Of course, the present embodiment is not limited to the connection configuration example shown in FIG. 2. Adjacent memory chips are connected to different ports in FIG. 2, but the adjacent memory chips may be connected to the same port for example. As a specific example, the memory chips 301 to 304 can be connected to the port A of each bus switch SW, the memory chips 305 to 308 can be connected to the port B of each bus switch SW, the memory chips 309 to 312 can be connected to the port C of each bus switch SW, and the memory chips 313 to 316 can be connected to the port D of each bus switch SW.

Figure 3:
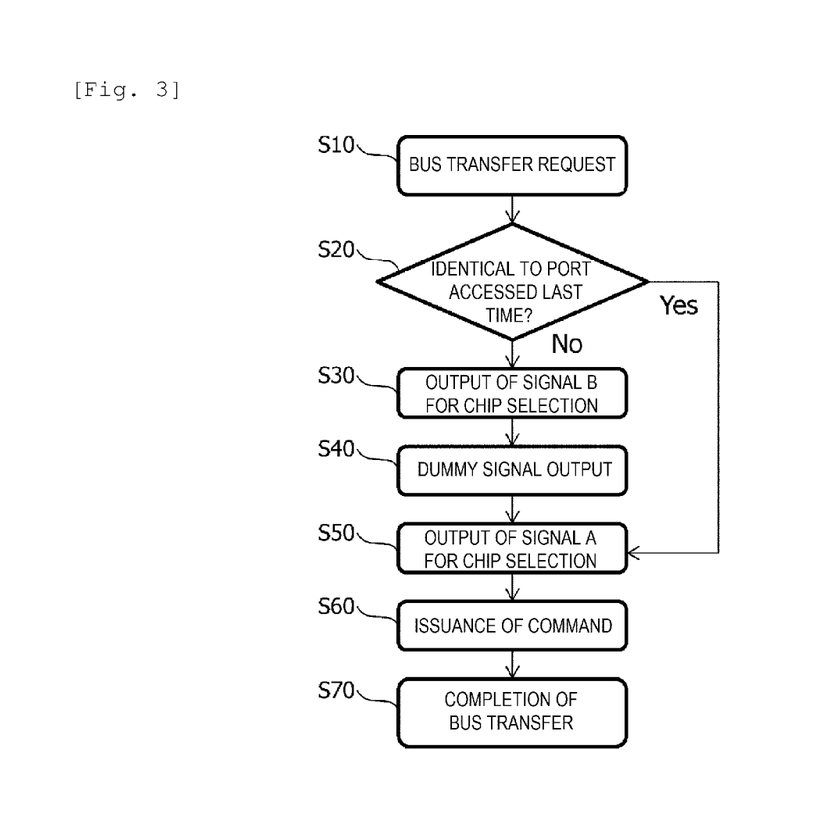
FIG. 3 is a flow chart showing a processing example of a memory controller according to the first embodiment of the invention.

FIG. 3 is a flow chart showing a processing example of the memory controller according to the first embodiment of the invention.

First, the memory controller 200 outputs a bus transfer request, and acquires a bus usage right (step S10). Subsequently, the memory controller 200 determines whether a port to be accessed this time (a port for an access object) is identical to a port accessed last time (step S20). The port for an access object may be determined, for example, by using a table recording correspondence between the port number for an address and the chip number, to obtain the port number from the address of an access destination. When it is determined that the port to be accessed this time is identical to the port accessed last time (the result in step S20 is Yes), the memory controller 200 allows the process to proceed to step S50.

When it is determined that the port to be accessed this time is not identical to the port accessed last time (the result in step S20 is No), the memory controller 200 outputs the signal B for chip selection, which designates the port to be accessed this time, to the latch circuit 500 (step S30). The latch circuit 500 receives and decodes the signal B for chip selection, stores and outputs a value showing the port number indicated by the signal B.

Subsequently, the memory controller 200 outputs a dummy signal to the data system signal line (step S40). The dummy signal may be a signal in any forms of commands, addresses or data, and for example, a read and status of a command can be used. Incidentally, since the signal A for chip selection is not outputted, none of the chips receive the dummy signal.

After the step S40 or the step S20, the memory controller 200 outputs the signal A for chip selection, which designates the chip to be accessed this time, to the decoder/switch 400

(step S50). The chip for the access object may be determined, for example, by using a table recording correspondence between the port number for an address and the chip number, to obtain the chip number from the address of an access destination.

Subsequently, the memory controller 200 issues a command via the data system signal line (step S60). For example, the memory controller 200 outputs a write command, a write address and write data in this order.

When the command is issued, the memory controller 200 outputs completion of the bus transfer, and releases the bus usage right (step S70).

Figure 4:
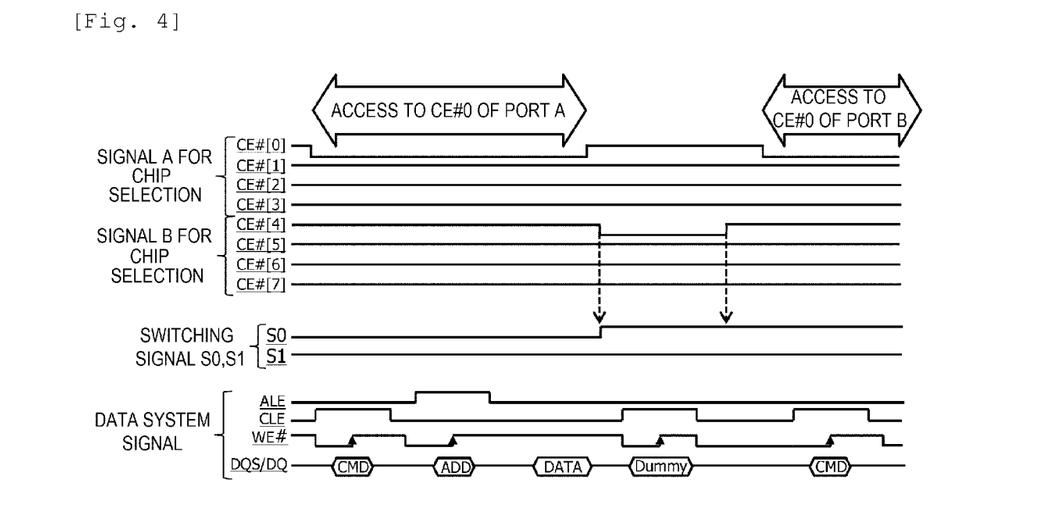
FIG. 4 is a timing chart showing an example of an output timing of a plurality of signals according to the first embodiment of the invention.

FIG. 4 is a timing chart showing an example of an output timing of a plurality of signals according to the first embodiment of the invention. FIG. 4 can be applied to the connection configuration example shown in FIG. 2. FIG. 4 shows a case of accessing chip 0 of the port B after accessing chip 0 of the port A.

During the period of asserting the signal A for chip selection (CE # [0]), a command (CMD), an address (ADR) and data (DATA) are transmitted. During this period, switching signals (S0 and S1) are asserted so as to indicate the port A. After the transmission of data (DATA) is completed, in order to switch from the port A to the port B, the signal B for chip selection (CE # [4]) is asserted. Accordingly, the switching signals (S0 and S1) are asserted so as to indicate the port B. A dummy signal (Dummy) is transmitted at the same time as or after the signal B for chip selection (CE # [4]). The port B is selected by the switching signals (S0 and S1). Thereafter, the signal A for chip selection (CE # [0]) is asserted, and the command (CMD), the address (ADR) and the data (DATA) are transmitted.

Incidentally, the general purpose memory controller may be designed such that the signal for chip selection cannot be outputted alone without a signal which is in the form of commands, addresses or data. Therefore, the memory controller 200 of the present embodiment outputs the dummy signal as described above. Of course, the invention is not limited thereto, so long as it is a specification in which the signal for chip selection can be outputted alone.

As shown in the example of the timing chart in FIG. 4, when the decoder/switch 400 is switched, a time zone (a time zone during which the dummy signal is issued) during which data cannot be accessed by the chip is generated. However, the time zone can be set sufficiently smaller than a data transfer time for transmitting data between the memory controller 200 and each storage unit 300, or a busy time of each storage unit 300, and the influence on performance (for example, latency) can be almost eliminated. For example, when a target latency of the semiconductor storage device 1 is set to be 100 μs, an output time zone of the dummy signal is 100 ns or less, so that an increase rate of the latency is 0.1% or less with the issuance of the dummy signal.

The first embodiment of the invention has been described above. For example, the semiconductor storage device 1 of the present embodiment divides the signal for chip selection outputted from the memory controller 200 into two signals and uses the two signals, switches the chip to be connected according to one signal (signal B), and enables (or selects) the chip to be accessed according to the other signal (signal A). Accordingly, the number of selectable memory chips can be increased without adding a signal line to the memory controller 200. That is, a large storage capacity can be realized with a low manufacturing cost.

In addition, for example, in the semiconductor storage device 1, apart (signal A) of the signal line for chip selection outputted from the memory controller 200 is connected to the decoder/switch 400, and the decoder/switch 400 switches the plurality of memory chips and is selectably connected thereto. Accordingly, it is possible to connect memory chips whose number is greater than or equal to the number of the signal line for chip selection outputted from the memory controller 200.

Second Embodiment

A semiconductor storage device 1A will be described, focusing on differences from that of the first embodiment. The same reference numerals are attached to constituent elements similar to those of the first embodiment, and the descriptions thereof are omitted.

Figure 5:
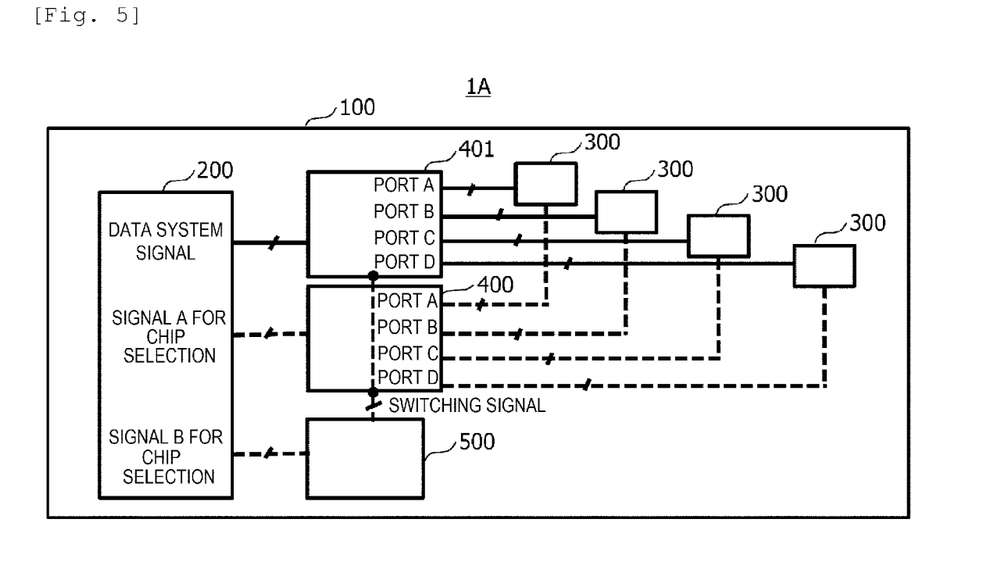
FIG. 5 is a diagram showing a schematic configuration example of a semiconductor storage device according to a second embodiment of the invention.

FIG. 5 is a diagram showing a schematic configuration example of a semiconductor storage device according to the second embodiment. The semiconductor storage device 1A includes a decoder/switch 401 (corresponding to a "second selection unit" of the invention) in addition to the decoder/switch 400. The data system signal line of the memory controller 200 is connected to the decoder/switch 401. The latch circuit 500 is connected to the decoder/switch 400 and the decoder/switch 401.

The decoder/switch 401 branches the data system signal line from the memory controller 200. The decoder/switch 401 includes ports A to D connected with each storage unit 300 respectively, and a bus switch (not shown) capable of selecting each port. In addition, the decoder/switch 401 includes a decoder (not shown) for decoding a switching signal outputted from the latch circuit 500 and configured to switch the ports. The decoder/switch 401 receives and decodes the switching signal from the latch circuit 500, and switches a connecting port to a port indicated by the switching signal (that is, selects a port). The decoder/switch 401 transfers a data system signal between the memory controller 200 and a storage unit 300 connected to the selected port.

In the semiconductor storage device 1A according to the second embodiment, since the load capacities of the plurality of storage units 300 are branched by the decoder/switch 401, a decrease in a slew rate of the data system signal is inhibited, and a high-speed transmission is enabled. In the semiconductor storage device 1A according to the first embodiment, since the load capacities of the plurality of storage units 300 are connected in series, the slew rate of the data system signal is decreased.

Third Embodiment

A semiconductor storage device 1B according to a third embodiment will be described, focusing on differences from that of the first embodiment. The same reference numerals are attached to constituent elements similar to those of the first embodiment, and the descriptions thereof are omitted.

Figure 6:
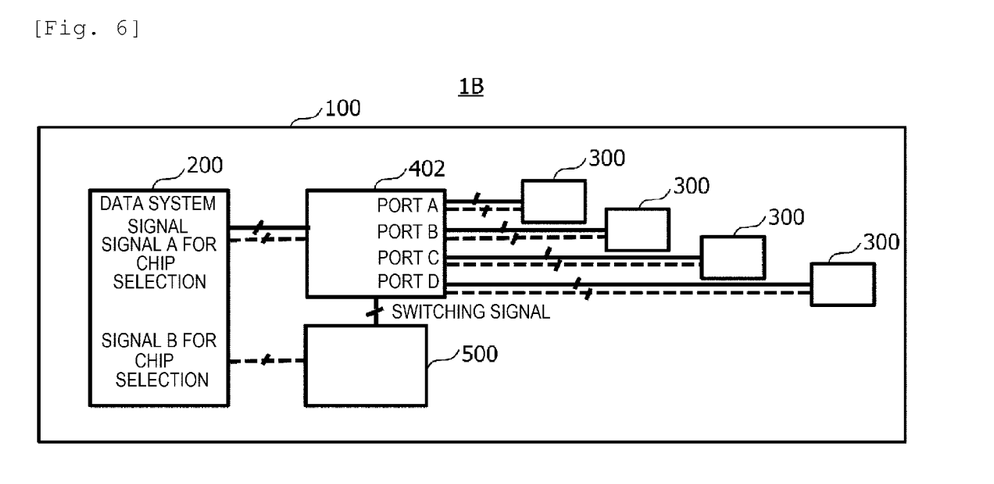
FIG. 6 is a diagram showing a schematic configuration example of a semiconductor storage device according to a third embodiment of the invention.

FIG. 6 is a diagram showing a schematic configuration example of a semiconductor storage device according to the third embodiment. The semiconductor storage device 1B includes a decoder/switch 402 instead of the decoder/switch 400. The data system signal line of the memory controller 200 is connected to the decoder/switch 402. In addition, a part (signal A) of the signal line for chip selection of the memory controller 200 is connected to the decoder/switch 402. The latch circuit 500 is connected to the decoder/switch 402.

Similar to the first embodiment, the decoder/switch 402 branches the signal line (signal A) for chip selection from the memory controller 200. That is, the decoder/switch 402 selects a port according to the switching signal, and outputs the signal A for chip selection to the selected port. In addition, similar to the second embodiment, the decoder/switch 402 branches the data system signal line from the memory controller 200. That is, the decoder/switch 402 transfers a data system signal between the memory controller 200 and a storage unit 300 connected to the selected port. Incidentally, at least a part of the circuit such as a decoder or a switch may be used in common such that a mounting area of the decoder/switch 402 is reduced.

Similar to the second embodiment, in the semiconductor storage device 1A according to the third embodiment, the decrease in the slew rate of the data system signal is inhibited, and the high-speed transmission is enabled. In addition, compared with the second embodiment, the mounting area of the decoder/switch can be reduced.

Fourth Embodiment

A semiconductor storage device 1C according to a fourth embodiment will be described, focusing on differences from that of the first embodiment. The same reference numerals are attached to constituent elements similar to those of the first embodiment, and the descriptions thereof are omitted.

Figure 7:
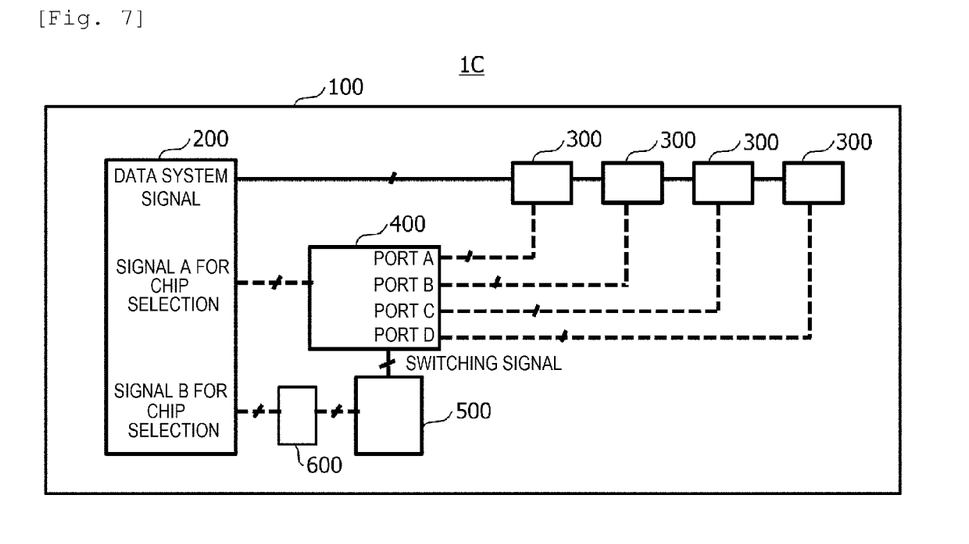
FIG. 7 is a diagram showing a schematic configuration example of a semiconductor storage device according to a fourth embodiment of the invention.

FIG. 7 is a diagram showing a schematic configuration example of a semiconductor storage device according to the fourth embodiment. The semiconductor storage device 1C includes a level shift circuit 600 (corresponding to a "voltage conversion unit" of the invention) between the memory controller 200 and the latch circuit 500.

The level shift circuit 600 is a voltage conversion circuit which converts a dynamic range of an output signal (signal B) of the memory controller 200 so as to conform to a dynamic range of an input signal of the latch circuit 500, and outputs the output signal (signal B). Accordingly, even if a voltage range of the output signal of the memory controller 200 is different from a voltage range of the input signal of the latch circuit 500, the signal can be reliably transmitted.

Incidentally, also in the semiconductor storage devices of the second embodiment and the third embodiment, the level shift circuit 600 may be provided between the memory controller 200 and the latch circuit 500.

Fifth Embodiment

Figure 8:
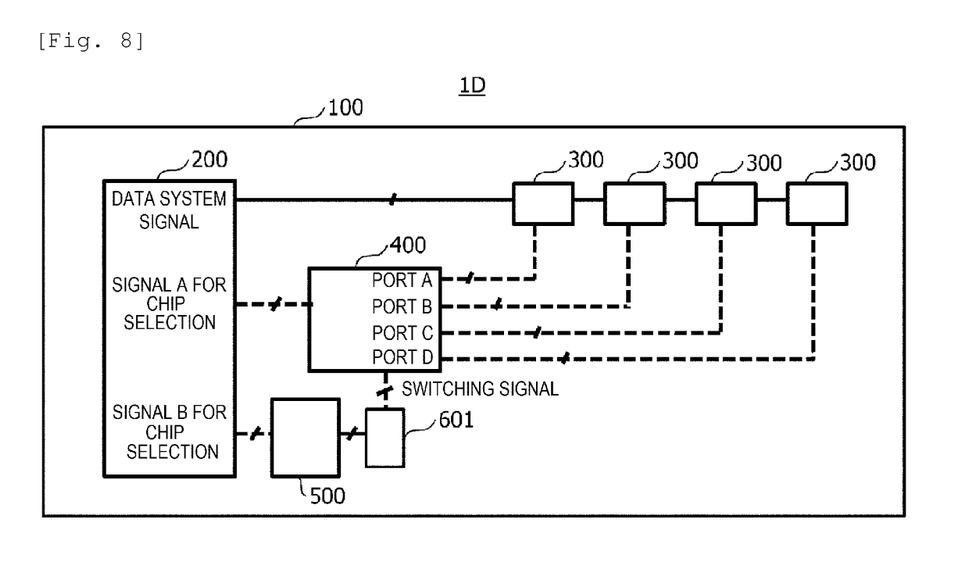
FIG. 8 is a diagram showing a schematic configuration example of a semiconductor storage device according to a fifth embodiment of the invention.

FIG. 8 is a diagram showing a schematic configuration example of a semiconductor storage device according to a fifth embodiment. A semiconductor storage device 1D includes a level shift circuit 601 (corresponding to the "voltage conversion unit" of the invention) between the latch circuit 500 and the decoder/switch 400.

The level shift circuit 601 is a voltage conversion circuit which converts a dynamic range of an output signal (a switching signal) of the latch circuit 500 so as to conform to a dynamic range of an input signal of the decoder/switch 400, and outputs the output signal (switching signal). Accordingly, even if a voltage range of the output signal of the latch circuit 500 is different from a voltage range of the input signal of the decoder/switch 400, the signal can be reliably transmitted.

Incidentally, also in the semiconductor storage devices of the second embodiment to the fourth embodiment, the level shift circuit 601 may be provided between the latch circuit and the decoder/switch.

The invention is characterized, for example, by the method of utilizing the signal for chip selection outputted from the memory controller, and the number of memory chips, the number of ports, and the connection configurations of the ports and the memory chips are not limited to the examples shown in FIGS. 1 to 8.

The invention is not limited to the above-mentioned embodiments, and includes various modifications. For example, each of the above-mentioned embodiments is described in detail to make the invention easy to understand, and the invention is not necessarily limited to those which have all the constituent elements described. In addition, it is possible to replace a part of the configuration of one embodiment to the configuration of another embodiment, and it is also possible to incorporate the configuration of one embodiment into the configuration of another embodiment. In addition, it is possible to add or replace another configuration to a part of the configuration of each embodiment.

The above-mentioned configurations, functions, processing units, processing means or the like may be implemented by hardware, for example, by designing part or all of them in an integrated circuit. In addition, the above-mentioned configurations, functions or the like may be implemented by software by a processor interpreting and executing programs implementing each function. Information on programs, tables, files or the like for implementing each function can be stored in a storage device such as a memory, a hard disk, and an SSD (Solid State Drive), or in a recording medium such as an IC card, an SD card, and a DVD (Digital Versatile Disc). In addition, control lines and information lines show what is considered to be necessary for the description, and not all the control lines and information lines are necessarily shown on the product. In practice, almost all the configurations may be considered to be mutually connected.

The invention can not only provide a semiconductor storage device, but also provide various aspects such as a storage device, a memory system, and a control method thereof.

REFERENCE SIGN LIST 1 (1A, 1B, 1C, 1D) semiconductor storage device
100 system substrate
200 memory controller
300 storage unit
301 to 316 memory chip
400 decoder/switch
401 decoder/switch
402 decoder/switch
500 latch circuit
600 level shift circuit
601 level shift circuit
A to D port
SW bus switch

The invention claimed is:
1. A semiconductor storage device, comprising:
a memory controller;
a plurality of memory chips;
a selection unit, which is connected to the memory controller, and is connected with the plurality of memory chips to be able to select any one of the plurality of memory chips; and
a switch unit, which is connected to the memory controller and the selection unit, wherein
the memory controller and the selection unit are connected by a signal line for transmitting a first signal outputted from the memory controller and configured to select the memory chips, the memory controller and the switch unit are connected by a signal line for transmitting a second signal outputted from the memory controller and configured to select the memory chips, the switch unit outputs a switching signal corresponding to the second signal to the selection unit, the selection unit selects any one of the plurality of memory chips according to the switching signal, and outputs the first signal to the selected memory chip, and the memory controller outputs the first signal to the selection unit after outputting the second signal to the switch unit.

2. The semiconductor storage device according to claim 1, wherein the memory controller and the plurality of memory chips are connected by a signal line for transmitting a data system signal, and the memory controller outputs a dummy signal including a command, an address or data to the plurality of memory chips, at the same time as or after outputting the second signal to the switch unit, and then outputs the first signal to the selection unit.

3. The semiconductor storage device according to claim 1, wherein the switch unit is configured by a latch circuit for storing and outputting a state of the switching signal corresponding to a state of the second signal.

4. The semiconductor storage device according to claim 1, wherein the plurality of memory chips are NAND flash memories, and the first signal and the second signal are a part of chip enable signals outputted from the memory controller.

5. The semiconductor storage device according to claim 1, wherein the selection unit, the memory controller, and the plurality of memory chips are connected by a signal line for transmitting a data system signal, and the selection unit selects any one of the plurality of memory chips according to the switching signal, and transfers the data system signal between the memory controller and the selected memory chip.

6. The semiconductor storage device according to claim 1, further comprising:

a voltage conversion unit, which is disposed at least either between the memory controller and the switch unit, or between the switch unit and the selection unit.

7. A semiconductor storage device comprising:

a memory controller;

a plurality of memory chips;

a selection unit, which is connected to the memory controller, and is connected with the plurality of memory chips to be able to select any one of the plurality of memory chips; and a switch unit, which is connected to the memory controller and the selection unit, wherein the memory controller and the selection unit are connected by a signal line for transmitting a first signal outputted from the memory controller and configured to select the memory chips, the memory controller and the switch unit are connected by a signal line for transmitting a second signal outputted from the memory controller and configured to select the memory chips, the switch unit outputs a switching signal corresponding to the second signal to the selection unit, and the selection unit selects any one of the plurality of memory chips according to the switching signal, and outputs the first signal to the selected memory chip, semiconductor storage device further comprising:

a second selection unit, which is connected to the memory controller, and is connected with the plurality of memory chips to be able to select any one of the plurality of memory chips, wherein the second selection unit, the memory controller and the plurality of memory chips are connected by a signal line for transmitting a data system signal, the switch unit is connected to the second selection unit, and outputs the switching signal to the second selection unit, and the second selection unit selects any one of the plurality of memory chips according to the switching signal, and transfers the data system signal between the memory controller and the selected memory chip.

* * * * *